United States Patent [19]

McQuiddy, Jr. et al.

[11] 3,860,879

[45] Jan. 14, 1975

[54] BROADBAND LOW NOISE PARAMETRIC AMPLIFIER

[75] Inventors: David N. McQuiddy, Jr.; Truman G. Blocker, both of Richardson, Tex.

[73] Assignee: Texas Instruments Incorporated, Dallas, Tex.

[22] Filed: Dec. 26, 1973

[21] Appl. No.: 427,898

[52] U.S. Cl. .................................... 330/4.9, 330/53

[51] Int. Cl. ............................................. H03f 7/04

[58] Field of Search ...................................... 330/4.9

[56] References Cited

UNITED STATES PATENTS 3,718,866 2/1973 Edrich ................................ 330/4.9

*Primary Examiner*—John Kominski
*Assistant Examiner*—Darwin R. Hostetter
*Attorney, Agent, or Firm*—Harold Levine; Rene'E. Grossman; Alva H. Bandy

[57] ABSTRACT

The specification discloses a low noise parametric amplifier for use with a radar receiver. A Gunn diode oscillator is provided to generate a pump frequency. A bandpass filter filters the pump frequency and applies the pump power through a waveguide having a reduced height portion employing a multi-section Chebycheff transformer. A coaxial signal input line connects through the waveguide to a coaxial idler section which is provided to terminate the signal input line and to match the signal and idler frequencies. A varactor diode assembly is mounted on the center conductor of the signal input line and the idler section. A cup member is attached to the diode assembly for matching the parallel resonance of the diode assembly to the pump frequency.

11 Claims, 9 Drawing Figures

BROADBAND LOW NOISE PARAMETRIC AMPLIFIER

FIELD OF THE INVENTION

This invention relates to parametric amplifiers, and more particularly relates to low noise parametric amplifiers for use in radar receivers.

THE PRIOR ART

In radar systems, it is important to have a very low noise amplifier in order to provide preamplification for the mixer in the radar receiver. It has thus been heretofore known to utilize parametric amplifiers in the "front end" of a radar receiver. However, the performance of previously developed parametric amplfiers have been limited by available varactor diodes with arbitrary fixed package parasitics. In addition, parametric amplifiers heretofore utilized for radar systems have often not been completely satisfactory with respect to both operating characteristics and cost considerations.

SUMMARY OF THE INVENTION

In accordance with the present invention, a parametric amplifier is provided which may be simply and easily tuned to provide the desired operating characteristics for a range of radar applications. The present parametric amplifier and varactor diode assembly thus substantially eliminates or reduces many of the problems heretofore associated with prior parametric amplifier designs.

In accordance with the present invention, a varactor diode assembly is provided for use in a parametric amplifier. The diode assembly includes a varactor diode and a conductive support for the diode. A nonconductive spacer is mounted on the support and a conductive cap is connected to the spacer remote from the support. A conductive lead is connected between the diode and the cap. A cup is dimensioned to fit adjacent the support and is provided with a capacitance such that the parallel resonance of the diode assembly is matched to the pump frequency.

In accordance with a more specific aspect of the invention, a low noise parametric amplifier for use with a radar receiver includes a Gunn diode oscillator for generating a pump frequency. A bandpass filter filters the pump power and applies it to a waveguide. The waveguide has a reduced height portion employing a multi-section Chebycheff transformer. A coaxial signal input line extends to the waveguide. A coaxial idler section terminates the signal input line and provides matching at the signal and idler frequencies. A varactor diode assembly is mounted on the center conductor between the signal input line and the idler section. A cup member is attached to the diode assembly for matching the parallel resonance of the diode assembly to the pump frequency.

In accordance with a further aspect of the invention, a method of matching a varactor diode assembly to a pump frequency in a parametric amplifier includes attaching the varactor diode within a package. The capacitance of the varactor diode and the package is then measured. The additional capacitance required for the parallel resonance of the diode assembly to match the pump frequency is determined. A cup member is then attached to the package, such that the resulting parallel resonance of the diode assembly is matched to the pump frequency.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
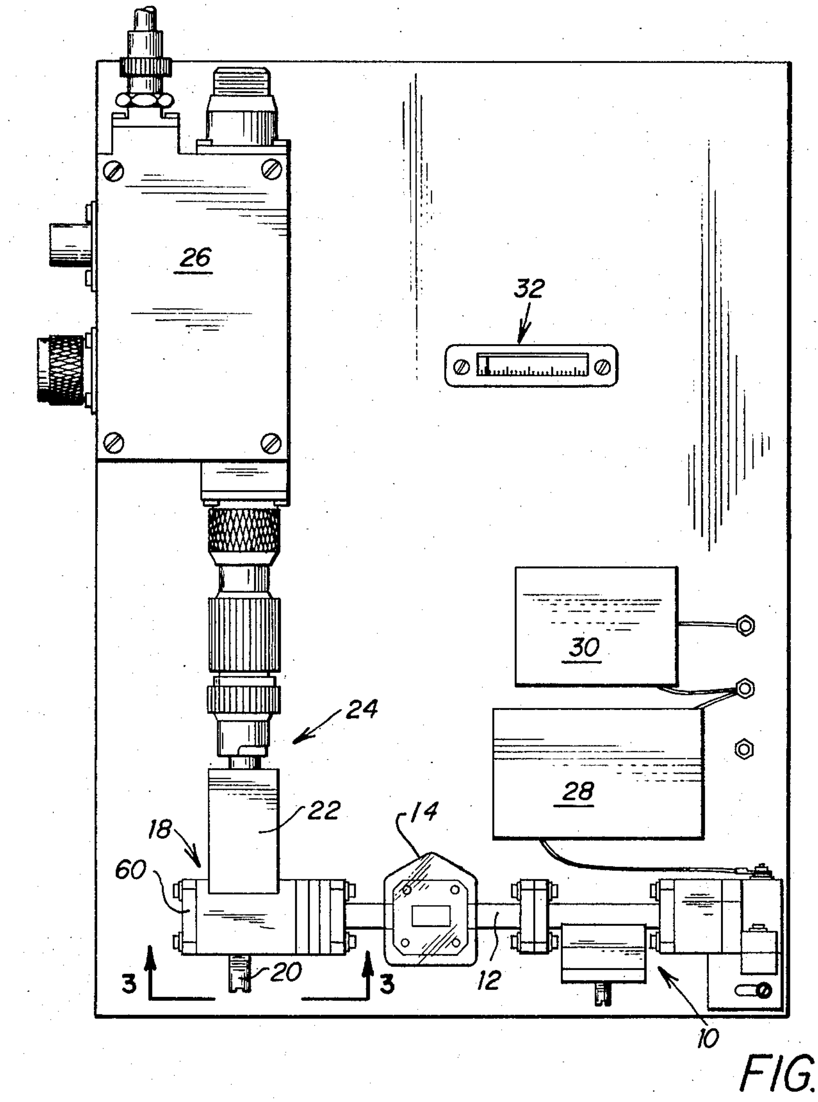
FIG. 1 is a top view of the parametric amplifier of the present invention.

FIG. 1 illustrates a top view of the parametric amplifier according to the invention. A pump source 10 comprises a gallium arsenide (GaAs) Gunn diode oscillator operating in the Ka band (26–40 GHz). For a more detailed description of the construction and operation of gallium arsenide Gunn diode oscillators, reference is made to "Procedures for the Design and Fabrication of High Power, High Efficiency Gunn Devices," by T. E. Hasty et al, Proceedings Third Biennial Cornell Conference on High Frequency Generation and Amplification, 325ff (1971) and "Device-Package-Circuit Optimization of Gunn Devices at Millimeter Wave Frequencies" by T. G. Blocker et al., Proceedings Fourth Biennial Cornell Conference on Microwave Semiconductor Devices (1973).

The pump source 10 generates a pump frequency which is applied through a crossguide coupler 12 to a test point 14 for monitoring the pump frequency and rf power. The pump power is then directed to a diode housing 18 which incorporates a gallium arsenide Schottky barrier varactor diode having a cutoff frequency exceeding 500 GHz. A coaxial idler section 20 is threaded into the housing 18 in order to provide a simultaneous match at the signal and idler frequencies. The idler section 20 is removable in order to enable the removal of the varactor diode as will be subsequently described.

Housing 18 includes a housing portion 22 containing the coaxial signal line incorporating series quarter-wave sections to provide broadbanding. The coaxial signal line is then connected to a four-port circulator 26 which is a conventional ferrite junction nonreciprocal device.

A printed circuit board 28 includes electrical circuitry, not shown in detail, to provide bias regulation for the Gunn oscillator. A printed circuit board 30 provides bias regulation for the varactor diode system. A meter 32 provides an indication of the varactor current.

The operation of parametric amplifiers is well known and is described in detail in such references as *Microwave Semiconductor Devices and Their Circuit Applications*, by H. A. Watson, McGraw-Hill (1969), chapter 8, pages 194–270. In addition, the article "Minimum Noise Figure of the Variable Capacitance Amplifier," by K. Kurokawa et al., Bell Systems Technical Journal 40, 695 (1961) further describes the theory and basic circuit considerations of parametric amplifiers.

Relevant parametric equations are as follows:

$$\omega_1 = \omega_{pump} - \omega_2 \quad (1)$$

$$R_{diode} = R_s(1 - Q_1 Q_2) \quad (2)$$

$$Q = \gamma Q = \gamma / \omega R_s C_o \quad (3)$$

$$T_e = (1 - 1/G) 1 + (\omega_1/\omega_2) Q_1 Q_2 / Q_1 Q_2 - 1 \; T_d \quad (4)$$

Wherein, $\omega_1$ = signal frequency,
$\omega_{pump}$ = pump frequency,
$\omega_2$ = idler frequency,
$R_{diode}$ = diode negative resistance,
$R_s$ = series resistance of varactor diode,
$Q$ = dynamic quality factor,
$\gamma$ = capacitance modulation factor,
$C_o$ = pump varactor capacitance,
$T_e$ = effective noise temperature of the parametric amplifier,
$G$ = reflective power gain,
$T_d$ = diode temperature Equation 1 is the fundamental relation between the signal frequency ($\omega_1$), the pump frequency ($\omega_{pump}$) and the idler frequency ($\omega_2$) for a parametric amplifier. Equation 2 is the maximum diode negative resistance expressed in terms of the dynamic quality factor Q at the signal and idler frequencies. The dynamic quality factor Q is defined in equation 3 in terms of the capacitance modulation factor, the varactor series resistance and the pump varactor capacitance. The expression for $\gamma$ can be written as:

$$\gamma = \frac{C_1}{C_0} = \frac{\int_0^{2\pi/\omega_p} C\{V(t)\} \cos \omega_p t \, dt}{\int_0^{2\pi/\omega_p} C\{V(t)\} \, dt} \quad (5)$$

For an abrupt junction (Schottky barrier) uniform profile diode where $C \sim V^{-1/2}$, gamma can be as high as 0.25 Equation 4 relates the effective diode noise temperature to the gain, the signal and idler frequencies, the dynamic quality factors $Q_1$ and $Q_2$, and the diode temperature.

It may be seen by reference to equation 4, that minimizing the varactor diode noise termperature at a given gain and ambient temperature requires that $\omega_1/\omega_2$, the signal-to-idler frequency ratio, must be minimized and the product $Q_1 \cdot Q_2$ must be maximized. The minimization of $\omega_1/\omega_2$, the signal-to-idler frequency ratio, may be accomplished by utilizing as high a pump frequency as possible, subject to limitations such as minimum *rf* pump power required, stability, reliability and cost. In the preferred embodiment, a gallium arsenide Gunn diode oscillator is provided which delivers 100–150 mW of rf power at 30–32 GHz. This provides an idler-to-signal ratio for the present invention of 9–10. Maximizing the product $Q_1 \cdot Q_2$ requires a high quality gallium arsenide Schottky barrier varactor to minimize the $R_s C_o$ product and to achieve cutoff frequencies at the desired bias voltage of greater than 500 GHz. Under conditions of high gain and $Q_1 \cdot Q_2 >> 1$, equation 4 simplifies to $$T_e \approx \omega_1/\omega_2 \; Td \quad (6)$$

Wherein, $$\omega_1/\omega_2 = 1/\mathbf{10}\text{th},$$
$$T_d = 300°\text{K (room temperature)},$$
$$T_e = 30°\text{K or } 0.45 \text{ dB}.$$

The Gunn oscillator 10 includes a diode mounted in a package manufactured and sold by Metalized Ceramics Corporation, West River Industrial Park, Providence, RI. Such packages utilize metal supports made from Kovar and a ceramic ring having dimensions of 0.036 inch outer diameter and 0.022 inch inner diameter. A 15 × 10 mil plated heatsink diode is soldered in the package and the packaged unit is soldered to a 0.100 inch diameter gold plated gold pedestal with an 0/80 threaded end. The oscillator D. C. power requirements are 750 mA at 6 volts and frequency tuning over a 1 GHz range may be accomplished mechanically with a dielectric rod.

Figure 2:
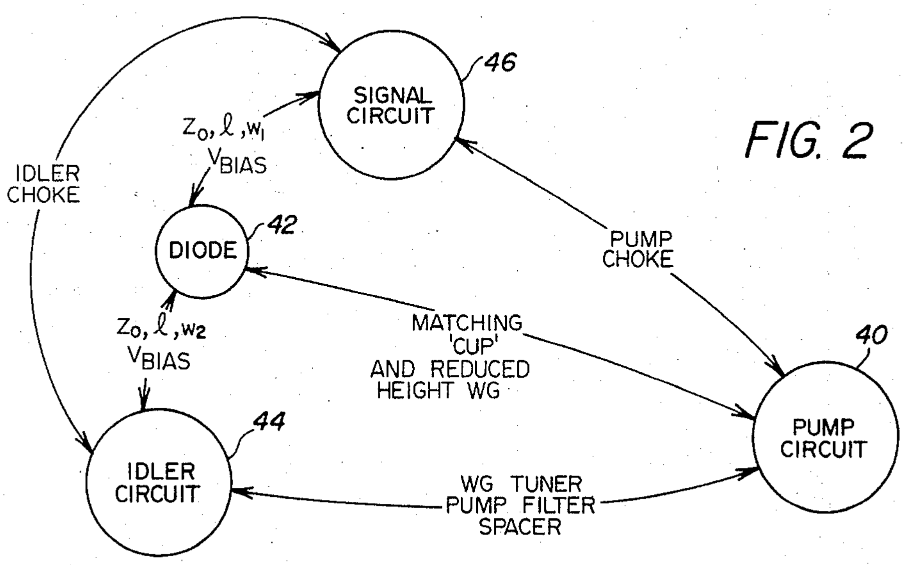
FIG. 2 is a diagrammatic illustration of the circuit interactions between the various portions of the parametric amplifier shown in FIG. 1.

FIG. 2 illustrates various interactions between the circuits in the present parametric amplifier. Parametric amplifiers are generally noted for their complexity because of the requirements of simultaneous matching conditions at three separate frequencies including the pump frequency, the idler frequency and the signal frequency, and in addition because of the consideration of impedance levels at other frequencies such as the sum-idler, $\omega_2 = \omega_{pump} + \omega_1$. Referring to FIG. 2, the pump circuit 10 interacts with the varactor diode 42, the idler circuit 44 and the signal circuit 46. A pump choke, as will be subsequently described, is disposed between the pump circuit 40 and the signal circuit 46 in order to provide isolation between the circuits. A matching cup, to be subsequently described, is utilized in conjunction with the varactor diode assembly 42 in order to match the parallel resonance of the diode 42 with the pump frequency.

A tuner and a pump filter spacer are utilized between the pump circuit 40 and the idler circuit 44, as will be subsequently described. An idler choke is disposed between the idler circuit 44 and the signal circuit 46 in order to provide isolation. The impedance and length of the coaxial section between the varactor diode 42 and the idler circuit 44 and signal circuit 46 is adjusted to provide matching. The present system is thus designed such that the various elements of the parametric amplifier interact with one another in a unique fashion to provide excellent matching and interaction between the various circuit components.

Figure 3:
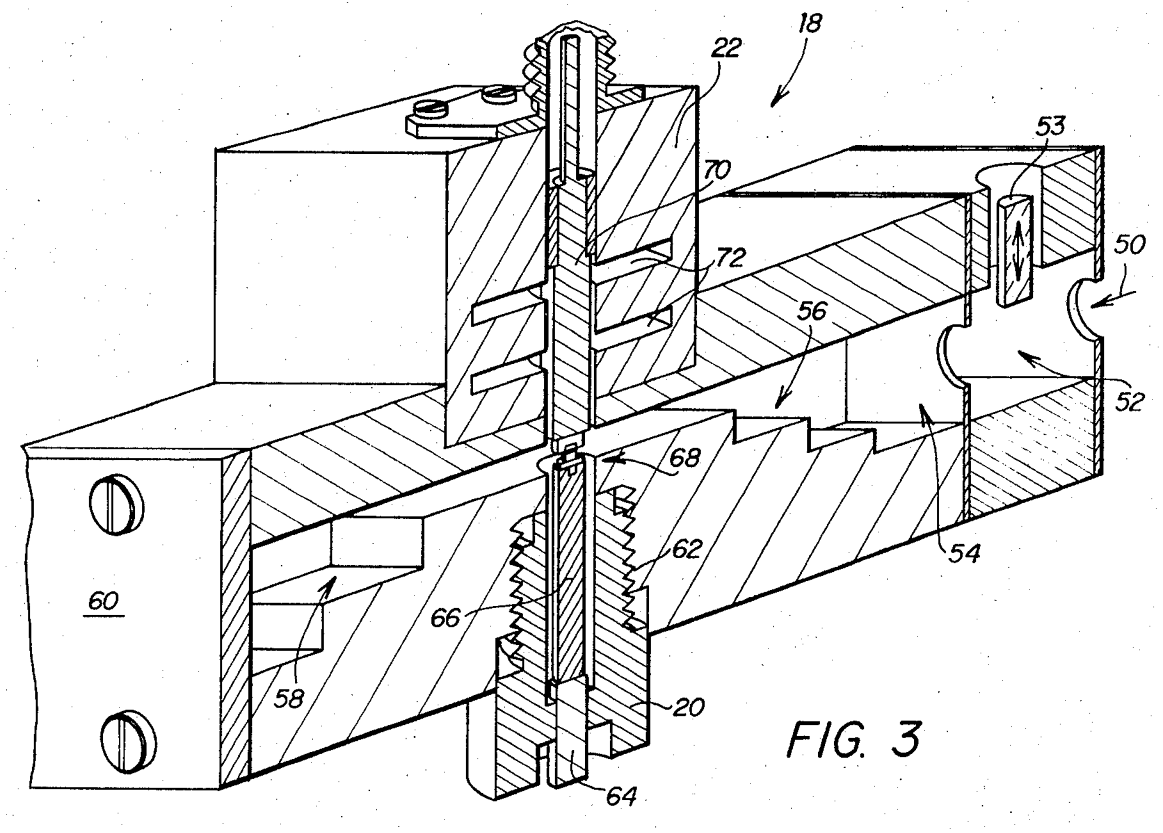
FIG. 3 is a perspective sectional view taken generally along the section line 3—3 in FIG. 1.

FIG. 3 illustrates a sectional view taken through the varactor diode housing 18. Pump energy is applied in the direction of the arrow 50 from the cross guide coupler 12 previously shown in FIG. 1 into a single section bandpass filter 52. The pump filter 52 is a single section iris coupled waveguide resonant element tuned to the pump frequency. A sapphire tuner 53 is also mounted in the filter. A suitable sapphire tuner is manufactured and sold by the Johanson Manufacturing Corporation of Boonton, New Jersey as the Model No. 6933 tuner. The pump energy is then applied into a reduced height waveguide section 54 which employs a three section Chebycheff transformer 56. A second multisection Chebycheff transformer 58 is provided in the waveguide and is terminated by an end plate or short 60.

The coaxial idler section 20 includes threaded portions 62 for being incorporated within the reduced height waveguide. The impedance and length of the coaxial idler section are adjusted and dimensioned to provide simultaneous matching at the signal and idler frequencies. An anodized aluminum bias feedthrough member 64 extends through the coaxial idler section. The varactor diode assembly 68 is mounted on the end of the center conductor of the coaxial idler section. A coaxial signal line 70 mechanically bears against the varactor diode assembly and extends outwardly through the housing 22 through the series quarter wave section filter to the circulator 26. Radial pump and idler chokes 72 are formed about the coaxial signal line 70 in order to prevent leakage of pump and idler energy into the signal circuit.

Figure 4:
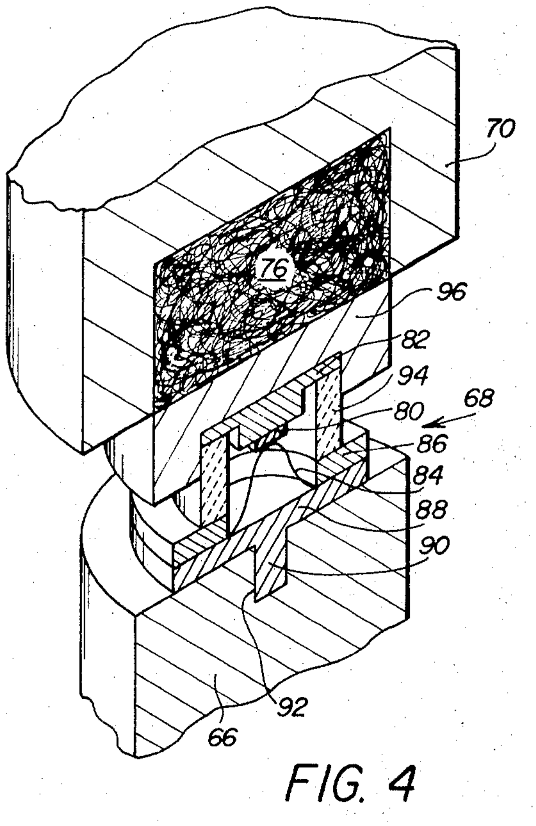
FIG. 4 is an enlarged view of the varactor diode assembly shown in FIG. 3.

The varactor diode assembly 68 is illustrated in FIG. 4 in an enlarged perspective sectional view. The coaxial signal line 70 includes a recess in the end thereof for receiving a copper-beryllium "fuzz button" 76 which comprises lengths of small diameter copper-beryllium wire formed in an intricate compressed mesh. The "fuzz button" 76 thus exerts continual pressure outwardly from line 70 in order to maintain positive mechanical contact against the varactor diode assembly 68.

The varactor diode assembly 68 includes a varactor diode 80 mounted on a conductive metal cylindrical support 82. A gold bond wire or lead 84 is approximately 40–50 mils long and is attached at the middle to the diode 80 and is bonded at the outer ends to a metallic ring 86. The ring 86 is bonded to a metallic cap 88 which includes an extension 90 which is received within an aperture 92 formed in the end of the coaxial idler 66. The support 82 and the ring 86 are electrically separated from one another by a ceramic cylindrical spacer member 94. The support 82, ceramic spacer member 94 and ring 86 may comprise for example the package part No. 60–2461 manufactured and sold by Metalized Ceramics Corporation. The support 82 and ring 86 may be constructed from metal such as Kovar, while the ceramic spacer member 94 may be constructed from $Al_2O_3$.

An important aspect of the varactor diode assembly 68 is the metallic conductive cup 96 which includes a circular recess for receiving the support 82. The base of the cup 96 bears against the "fuzz button" 76. The conductive cup 96 is dimensioned to provide a capacitance such that the parallel resonance of the entire diode assembly 68 is matched with the pump frequency.

Figure 5:
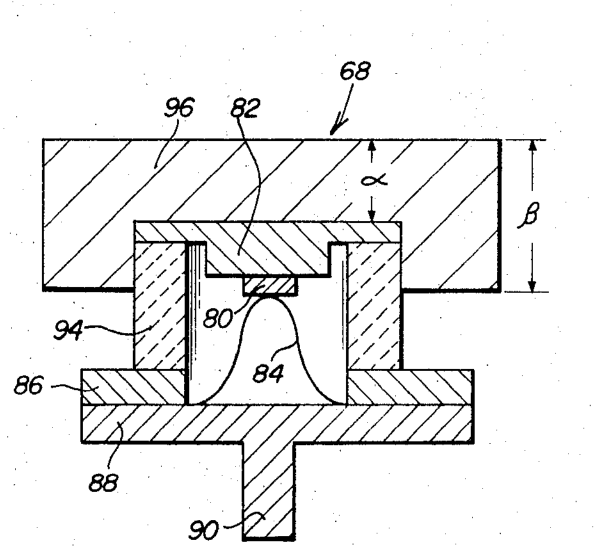
FIG. 5 is a sectional view of the varactor diode assembly shown in FIG. 4 and illustrating the dimensions of the conductive cup of the invention.
Figure 6:
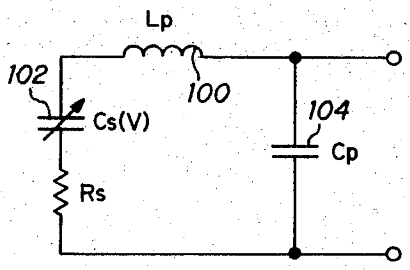
FIG. 6 is an equivalent electrical circuit of the varactor diode assembly without the cup of the invention.

FIG. 5 illustrates the dimensions of the various diode assembly components relative to the conductive cup 96. The inner and outer diameters of the cylindrical cup are maintained constant from one system to another, but the dimensions $\alpha$ and $\beta$ are varied in order to provide the exact capacitance required for a specific system. FIG. 6 illustrates an equivalent electrical circuit of the diode assembly 68 excluding the cup 96. An inductance 100 represents the inductance provided by the bond lead 84. The variable capacitance 102 represents the capacitance provided by the varactor diode 80. The resistance $R_s$ represents the resistance provided by the varactor diode. Capacitance 104 represents the capacitance provided by the diode package including support 82, ring 86, cap 88 and ceramic spacer member 94.

As is known, gallium arsenide varactor diodes are currently commercially available in a variety of dimensions and operating characteristics. However, such commercially available varactor diodes often do not have the exact capacitance required when packaged in order to match with a particular pump frequency. It is extremely expensive and time consuming in order to reconstruct a varactor diode to have a particular capacitance. Therefore, the cup 96 is provided in order to enable adjustment of the capacitance of the total varactor diode assembly such that the parallel resonance of the assembly matches with the pump frequency.

By properly choosing the capacitance of the cup 96, the parallel resonant frequency of the varactor diode assembly may thus be tailored to match any desired pump frequency. This technique eliminates the requirement of having to redesign the parametric amplifier.

Figure 7:
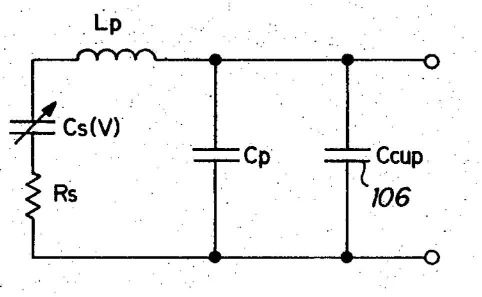
FIG. 7 is an equivalent electrical circuit of the varactor diode assembly of the invention with the cup member attached thereto in order to provide matching of the parallel resonance of the assembly.

The capacitance added to the varactor diode assembly by the cup 96 is shown as capacitance 106 in FIG. 7. The parallel resonance of the circuit of FIG. 7 may thus be defined as:

$$f_p = \frac{1}{2\pi\sqrt{\left[\frac{C_s \cdot (C_p + C_{cup})}{C_s + C_p + C_{cup}}\right] Lp}} \qquad (7)$$

FIG. 5 illustrates the dimensions $\alpha$ and $\beta$ of the cup 96 which are varied in accordance with the present invention to enable matching of specific diode assemblies as shown in the Table I below. In these examples, the outer diameter of the cup 96 is 0.08 inch and the inner diameter of the cup 96 is 0.05 inch.

TABLE I

| Diode No. | Diode Capacitance | Cup Capacitance | $\alpha$ | $\beta$ |
|---|---|---|---|---|
| A | .527pF | .141pf | .0112 | .0285 |
| B | .541 | .130 | .0113 | .0270 |
| C | .575 | .119 | .0112 | .0260 |

Figure 8:
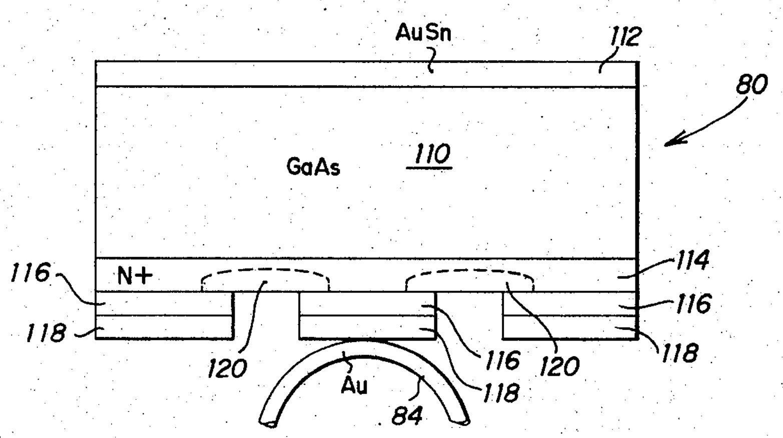
FIG. 8 is a sectional diagram of a gallium arsenide varactor diode according to the invention.

Referring to FIG. 5, the gallium arsenide varactor diode 80 is soldered to the support 82 with a gold-tin perform. FIG. 8 illustrates in detail the construction of the varactor diode 80. A gallium arsenide substrate 110 having a donor impurity concentration of approximately $2 \times 10^{18}$ atoms per cubic centimeter is provided with a contact layer 112 formed from AuSn and an N+ layer 114 having a donor impurity concentration of approximately $5 \times 10^{16}$ atoms per cubic centimeter. The diameter of the substrate 110 is approximately 0.015 inches and the substrate has a thickness of approximately 3 mils. A plated platinum layer 116 also includes a plated gold layer 18 on the exterior thereof.

The gold bond wire 84 is bonded to the center region of the gold layer 118. An important aspect of the invention is that the length of the gold bond wire 84 is chosen to provide a proper inductance Lp (FIG. 7) to control the series resonance of the varactor diode assembly. The series resonance frequency is given by the formula:

$$f_s = 1/2\pi \sqrt{L_p C_s(V)} \tag{8}$$

The utilization of the configuration of the bond wire 84 in adjusting the series resonance of the diode assembly is found to provide distinctly better results than previously developed techniques utilizing an arbitrary bond wire configuration. Most diode manufacturers attempt to minimize the bond lead inductance rather than optimize it as is done in the present invention.

After the varactor diode 80 has been soldered into the package and has been bonded to the bond wire 84 by thermal compression techniques with a hot chisel, the device is etched with a base solution. Portions of the layer 114 are thus etched away as indicated by the dotted lines 120. This etching technique enables optimization of the capacitance of the diode assembly. The etching is thus continued until a desired value of the capacitance of the diode assembly is reached. The assembly is then washed and cleaned and the cap 88 is then welded on in order to hermetically encapsulate the assembly.

The resulting capacitance of the entire diode assembly, without the cup 96, is then measured. As the pump frequency is known, the necessary capacitance for the cup 96 may be easily determined by solution of equation 7 in order to provide matching of the parallel resonance of the diode assembly with the pump frequency. A plurality of cups 96 will ordinarily be machined and the capacitances thereof previously measured and noted. One of the plurality of previously machined cups having the desired capacitance is then chosen and inserted on the diode assembly in the manner shown in FIGS. 4 and 5. The total capacitance of the diode assembly including the cup 96 is then measured to determine that the proper capacitance is provided in order to provide matching of the parallel resonance of the diode assembly with the pump frequency. The total assembly is then inserted between the coaxial idler 66 and the coaxial signal line 70 as shown in FIG. 4.

An important aspect of the invention is that the entire coaxial idler and varactor diode assembly may be easily removed because of the threads 92 on the idler section.

For given varactor parameters (capacitance $C_s(V)$ and series resistance $R_s$ as shown in FIGS. 5 and 7) and a given package configuration (shunt capacitance $C_p$, cup capacitance $C_{cup}$ and lead inductance $L_p$), there are discrete solution pairs for the matching equations at the signal and idler frequencies. These solution pairs (Zo,1) are the coaxial impedance determined by the center conductor diameter and the cavity length. A typical set of diode package parameters and the optimum choice of coaxial impedance and cavity length are as follows:

TABLE II

Diode-Package Parameters
$C_s(V) = .4$ pF
$C_p = .2$ pF
$Lp = .2\ \mu H$
$f_s = 2.8$ GHz, $f_i = f_p - f_s = 28.06$ GHz
$f_p = 1/2\pi \quad Lp(C_s(V) \cdot C_p / C_s + C_p) = 30.86$ Solutions

| Zo | 1 | |
|---|---|---|
| 144 Ω | .385″ | ($\lambda_i$) |
| 80 | .580 | (3 λi/2) |
| 40 | .770 | (2 λi) |
| 12 | .960 | (5 λi/2) |

As previously noted, the signal circuits are constructed in a coaxial configuration. The outer diameter of the coaxial line is selected to be consistent with the suppression of higher order coaxial modes. In order to minimize the signal circuit insertion loss (insertion loss adds to noise figure), it is desirable to use large outer diameters. In the preferred embodiment, a compromise is reached for the amplifier such that the diameter through the radial chokes is 3 millimeters to prevent higher order modes. Outside the radial choke sections 72, the outer conductor is expanded to seven millimeters and a low insertion loss is realized.

Figure 9:
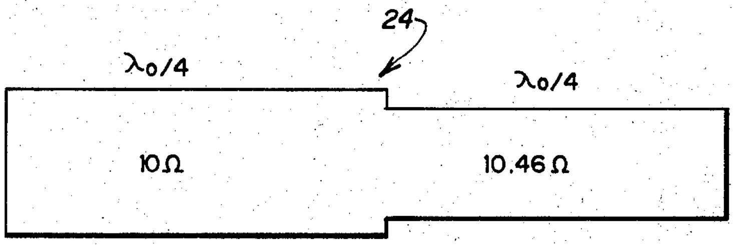
FIG. 9 is a somewhat diagrammatic illustration of a series quarter wave section filter for broadbanding the gain frequency response of the amplifier to the desired bandwidth and ripple specifications.

FIG. 9 illustrates the series quarter wave section filter 24 previously shown in FIG. 1 which enables the broadbanding of the gain-frequency response of the amplifier to the desired bandwidth and ripple specifications. The analysis of W. J. Getsinger specified in "Prototypes for Use in Broadbanding Reflection Amplifiers," IEEE Transactions on Microwave Theory and Techniques, MTT11, pages 486–497 (November, 1963) is utilized in the determination of the filter configuration. Use of the series quarter wave sections 24 in place of bulky and expensive tuning stubs is significant. The series quarter wave section filter 24 was determined to be possible by analysis of the impedance frequency dependence of the single tuned amplifier, wherein it was found that a substantial amount of roll-off of the diode negative resistance for the chosen coaxial idler length occurred. A conjugate match for the impedance waveform was thus provided by the series quarter wave sections shown in FIG. 9.

It may thus be seen that the present invention provides a parametric amplifier having extremely low noise characteristics and which is extremely useful in radar receiver circuits. The present parametric amplifier has been found to provide a center frequency of 2,800 MHz, a gain of 15 dB minimum and a 1 dB bandwidth of 200 MHz. In addition, the amplifier provides a gain variation of 1 dB maximum and a noise figure at 65° centigrade ambient of 1.15 dB (87 K). The present amplifier is completely solid state and extremely reliable and stable in operation. Due to the use of the matching cup technique of the invention, the varactor diode assembly may be tailored to match with the various frequencies involved in the amplifier without the requirement of substantial redesign of a varactor diode device.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A low noise parametric amplifier for use with a radar receiver comprising:
- a Gunn diode oscillator for generating a pump frequency,
- a bandpass filter for filtering said pump frequency,
- a waveguide for transmitting said filtered pump frequency, said waveguide having a reduced height portion employing a multi-section Chebycheff transformer,
- a coaxial signal input line extending to said waveguide,
- a coaxial idler section having a center conductor for terminating said signal input line and for providing matching at the signal and idler frequencies,
- a varactor diode assembly mounted on said center conductor between said signal input line and said idler section, and
- a cup member attached to said diode assembly for matching the parallel resonance of said diode assembly to said pump frequency.

2. The parametric amplifier of claim 1 and further comprising:
- a dielectric tunable spacer mounted in said waveguide.

3. The parametric amplifier of claim 1 and further comprising:
- radial chokes formed in said coaxial signal input line to isolate the pump and idler frequencies from said signal input line.

4. The parametric amplifier of claim 1 and further comprising:
- a waveguide short connected to the end of said waveguide opposite said bandpass filter.

5. The parametric amplifier of claim 4 and further comprising:
- a second reduced height portion of said waveguide employing a multi-section Chebycheff transformer and located between said waveguide short and said varactor diode.

6. The parametric amplifier of claim 1 wherein said varactor diode assembly includes a band lead having an inductance such that the series resonance of said diode assembly matches said pump frequency.

7. The parametric amplifier of claim 1 wherein said bandpass filter comprises a single section iris coupled resonant element tuned to the pump frequency.

8. The parametric amplifier of claim 1 and further comprising:
- a compressed metallic fuzzy button mounted within the center conductor of said signal input line for providing positive mechanical contact against said varactor diode.

9. The parametric amplifier of claim 1 wherein said diode assembly comprises:
- a varactor diode,
- a conductive support for said diode,
- a nonconductive spacer mounted on said support,
- a conductive cap connected to said spacer remote from said support and including an extension for being mounted in said center conductor of said coaxial idler section, and
- a conductive lead connected between said diode and said cap.

10. The parametric amplifier of claim 1 wherein said Gunn diode oscillator operates in the Ka-band and said varactor diode assembly has a cutoff frequency exceeding 500 GHz.

11. The parametric amplifier of claim 1 and further comprising:
- series quarter wave filters connected to said signal input line to broadband the gain-frequency response of the amplifier.

* * * * *

UNITED STATES PATENT OFFICE

CERTIFICATE OF CORRECTION

Patent No. 3,860,879 Dated January 14, 1975

Inventor(s) David N. McQuiddy, Jr., et al.

It is certified that error appears in the above-identified patent and that said Letters Patent are hereby corrected as shown below:

Column 3, equation 2, should read --$R_{diode}=R_s(1-\tilde{Q}_1 \tilde{Q}_2)$--; equation 3 should read --$\tilde{Q}=\gamma Q=\gamma/\omega R_s C_o$--; Equation 4 should θεαφ read $$T_e=(1-\frac{1}{G})\frac{1+(\omega_1/\omega_2)\tilde{Q}_1\tilde{Q}_2}{\tilde{Q}_1\tilde{Q}_2-1}T_d$$

lines 36, 47, and 49 "Q" each occurrence should read --$\tilde{Q}$--; line 67, "$Q_1$" should read --$\tilde{Q}_1$--; and "$Q_2$" should read --$\tilde{Q}_2$--. Column 4, lines 5, 14, and 18 "$Q_1 \cdot Q_2$" each occurrence should read --$\tilde{Q}_1 \cdot \tilde{Q}_2$--.

Column 8, table II, the definition of diode package parameter $f_p$ should read --$1/2\pi\sqrt{Lp(C_s(V)\cdot C_p/(C_s+C_p))}$--.

Signed and Sealed this

*thirtieth* Day of *December 1975*

[SEAL]

*Attest:*

RUTH C. MASON
*Attesting Officer*

C. MARSHALL DANN
*Commissioner of Patents and Trademarks*